United States Patent [19]
Nagai

[11] Patent Number: 5,815,522
[45] Date of Patent: Sep. 29, 1998

[54] SEMICONDUCTOR LASER

[75] Inventor: Yutaka Nagai, Itami, Japan

[73] Assignee: Mitsubishi Denki Kabushiki Kaisha, Tokyo, Japan

[21] Appl. No.: 584,201

[22] Filed: Jan. 11, 1996

[30] Foreign Application Priority Data

Apr. 5, 1995 [JP] Japan .................................. 7-080222

[51] Int. Cl.⁶ .................................................. H01S 3/19
[52] U.S. Cl. ............................................. 372/46; 372/45
[58] Field of Search .................... 372/43, 45, 46

[56] References Cited

U.S. PATENT DOCUMENTS

| | | | |
|---|---|---|---|
| 4,824,798 | 4/1989 | Burnham et al. | 437/81 |
| 4,845,725 | 7/1989 | Welch et al. | 372/46 |
| 4,875,216 | 10/1989 | Thornton et al. | 372/45 |
| 5,089,437 | 2/1992 | Shima et al. | 437/129 |
| 5,469,457 | 11/1995 | Nagai et al. | 372/45 |

FOREIGN PATENT DOCUMENTS 6302906  10/1994  Japan .

OTHER PUBLICATIONS

Arimoto et al, "150 mW Fundamental–Transverse–Mode Operation of 670 nm Window Laser Diode", IEEE Journal of Quantum Electronics, vol. 29, No. 6, 1993, pp. 1874–1879 Jun.

Primary Examiner—Rodney B. Bovernick
Assistant Examiner—Ellen E. Kang
Attorney, Agent, or Firm—Leydig, Voit & Mayer, Ltd.

[57] ABSTRACT

An n type lower cladding layer, a quantum well structure active layer, a p type upper cladding layer, and a p type contact layer are epitaxially grown in this order on an n type GaAs substrate, and then a stripe-shaped SiN film extending in the laser resonator length direction and having a length not reaching the vicinity of a region that becomes a laser resonator facet is formed on the contact layer. An In film is formed on the SiN film and the contact layer and then heat treatment is performed, diffusing In to a depth reaching the lower cladding layer and disordering a part of the quantum well structure active layer. The active layer in the vicinity of the laser resonator facet is disordered by diffusing In at a temperature as low as 600° C., and a window structure can be formed without diffusing a dopant impurity at a high temperature.

2 Claims, 7 Drawing Sheets

Fig.5 (a) (PRIOR ART)
Fig.5 (b) (PRIOR ART)
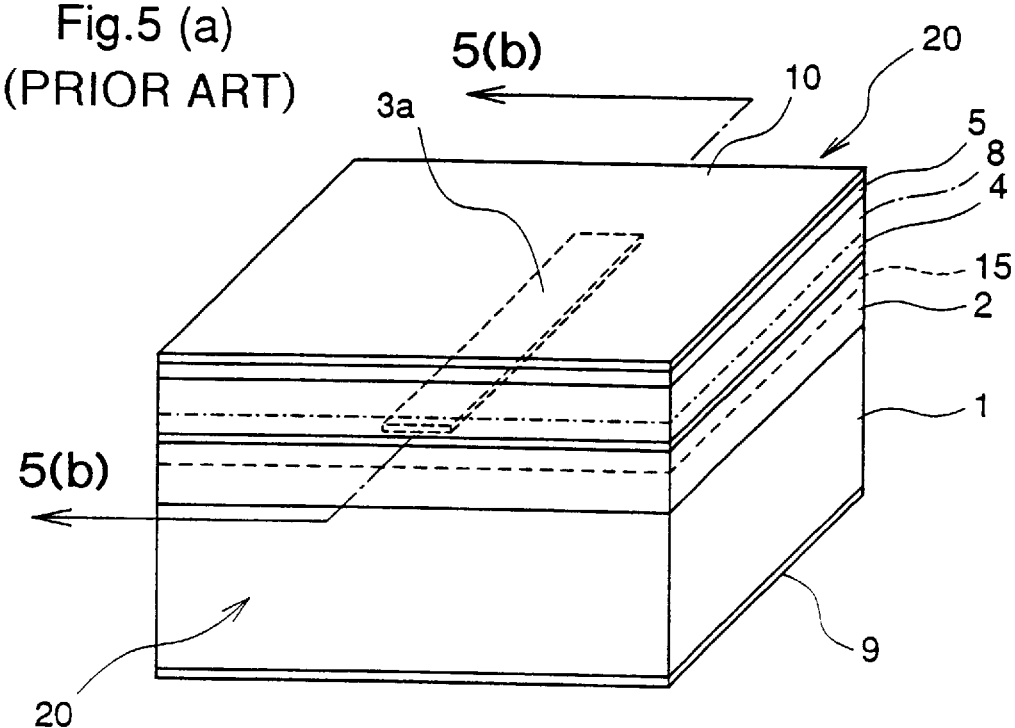
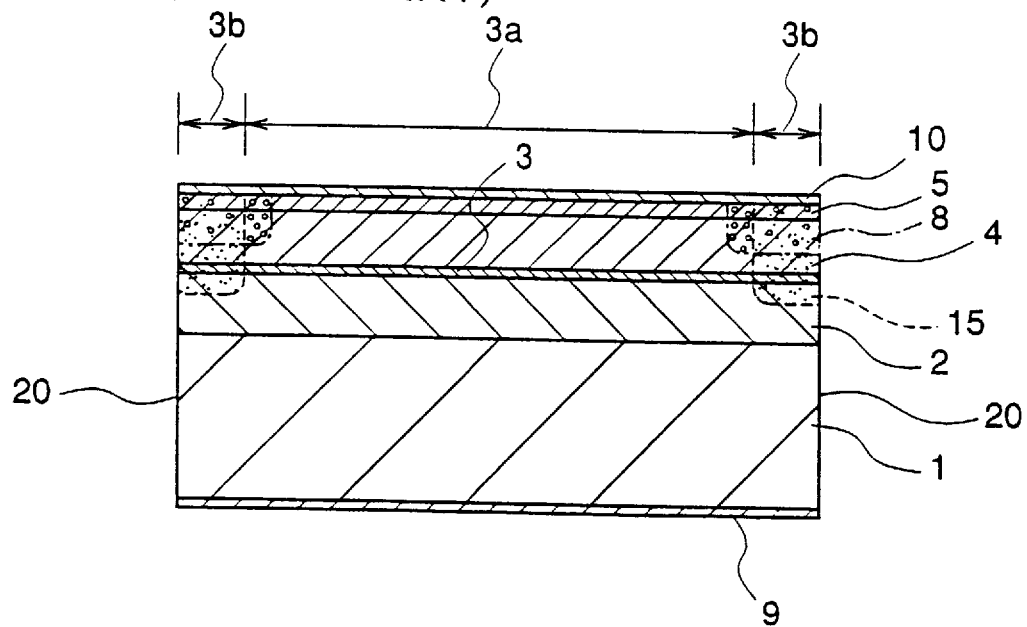

Fig.6 (a) (PRIOR ART)
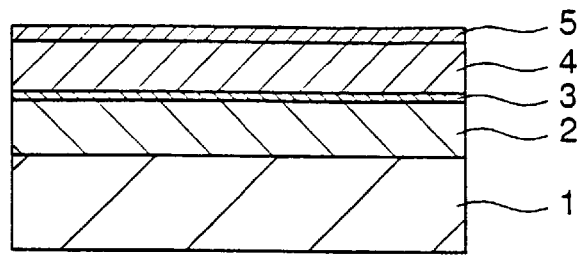
Fig.6 (b) (PRIOR ART)
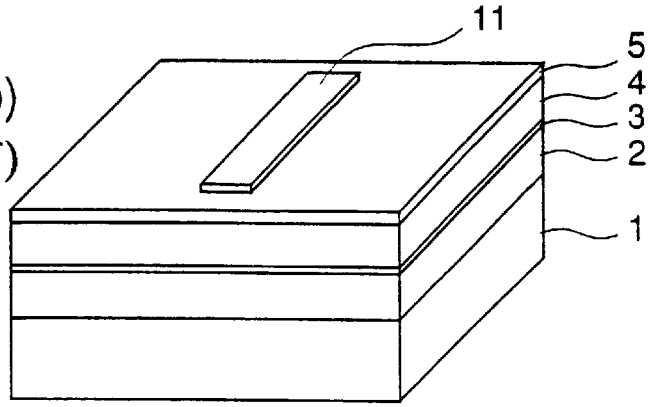
Fig.6 (c) (PRIOR ART)
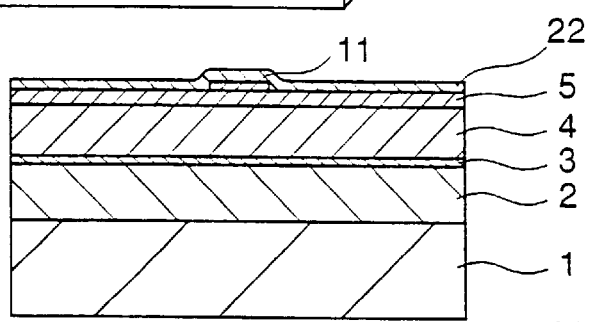
Fig.6 (d) (PRIOR ART)
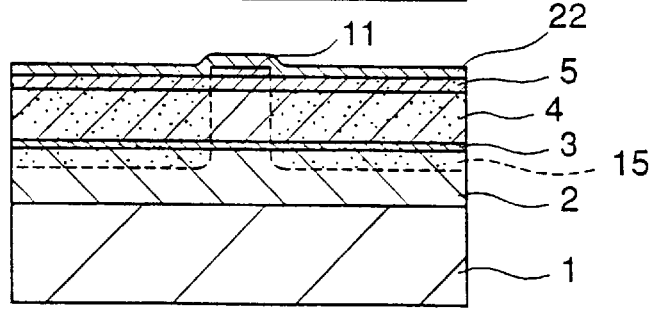
Fig.6 (e) (PRIOR ART)
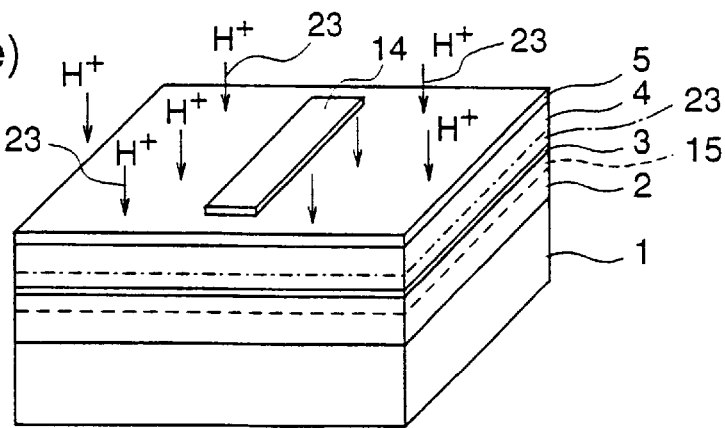

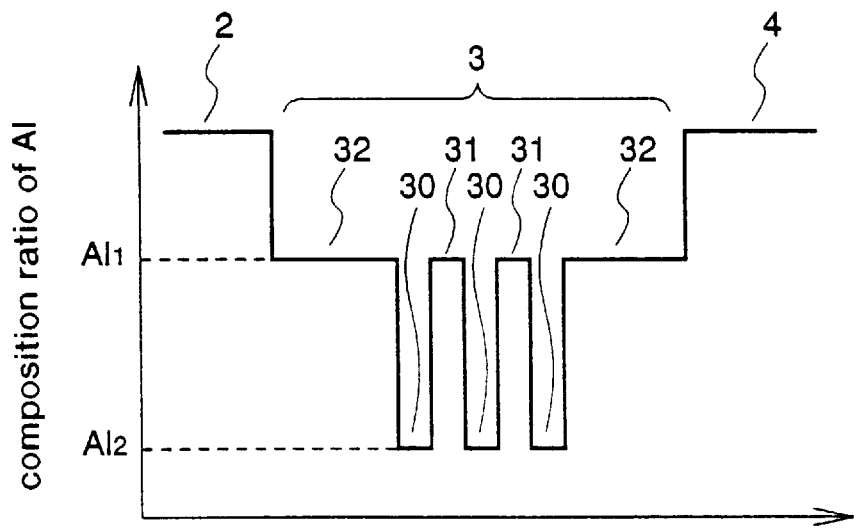
Fig.7 (a) (PRIOR ART)
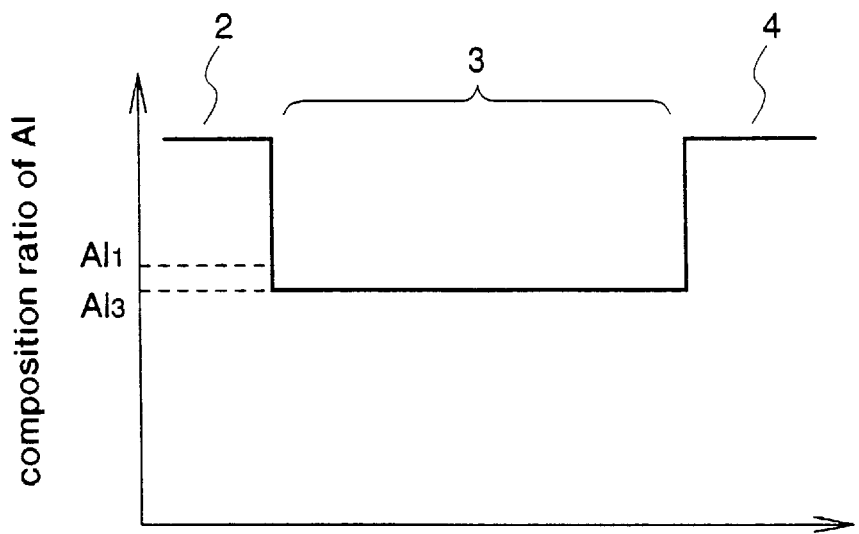
Fig.7 (b) (PRIOR ART)

5,815,522

1

SEMICONDUCTOR LASER

FIELD OF THE INVENTION

The present invention relates to a method of fabricating a semiconductor laser and a semiconductor laser fabricated thereby, and more particularly to a method of fabricating a semiconductor laser which has a window structure at a facet and is capable of high light output operation and a semiconductor laser fabricated thereby.

BACKGROUND OF THE INVENTION

FIGS. 5(a)–5(b) illustrate a prior art semiconductor laser. FIG. 5(a) is a perspective view of the prior art semiconductor laser, and FIG. 5(b) is a cross-sectional view of the same semiconductor laser taken along the 5b—5b line in FIG. 5(a), that is, a cross-sectional view along the resonator length direction. In the figures, reference numeral 1 designates an n type GaAs semiconductor substrate. An n type $Al_xGa_{1-x}As$ lower cladding layer 2 have a composition ratio of aluminum of x=0.5 and of a thickness of 1.5–2.0 μm is disposed on the substrate 1. Reference numeral 3 designates a quantum well structure active layer which comprises a five-layer structure comprising three $Al_yGa_{1-y}As$ well layers of a thickness of about 10 nm and a composition ratio of aluminum of y=0.05–0.15 and two $Al_zGa_{1-z}As$ barrier layers of a thickness of about 10 nm and a composition ratio of aluminum of z=0.2–0.35, the well layers and the barrier layers being alternately laminated, and two light guide layers of a thickness of about 35 nm and of the same composition as that of the barrier layers, one being disposed on the uppermost well layer and the other under the lowermost well layer of the five-layer structure. Reference numeral 4 designates a p type $Al_rGa_{1-r}As$ upper cladding layer of a thickness of 1.5–2.0 μm and a composition ratio of aluminum of r=0.5, reference numeral 5 designates a p type GaAs contact layer of a thickness of 0.5–1.0 μm, reference numeral 8 designates a proton implantation region, reference numeral 9 designates an n side electrode, reference numeral 10 designates a p side electrode, reference numeral 15 designates a silicon (Si) diffusion region, reference numeral 20 designates a laser resonator facet, reference numeral 3a designates an active region of an active layer 3 which contributes to laser light emission, and reference numeral 3b designates a window structure region formed in the vicinity of the laser resonator facet of the active layer 3. The dimensions of this semiconductor laser are 300–600 μm in length in the resonator length direction and about 300 μm in width.

FIGS. 6(a)–6(e) are process diagrams illustrating a method of fabricating the prior art semiconductor laser shown in FIGS. 5(a)–5(b). In the figures, the same reference numerals used in FIGS. 5(a)–5(b) designate the same or similar parts, reference numeral 11 designates a stripe-shaped SiN film, reference numeral 14 designates a photoresist, reference numeral 22 designates an Si film, and reference numeral 23 designates proton implantation.

The prior art method of fabrication will be described with reference to FIGS. 6(a)–6(e). The lower cladding layer 2, the quantum well structure layer 3, the upper cladding layer 4, and the contact layer 5 are epitaxially grown in this order on the n type GaAs semiconductor substrate 1 in a wafer state (not shown as a wafer in the figures). The cross-section of the wafer after the epitaxial growth is shown in FIG. 6(a). Next, the SiN film is formed on the surface of the contact layer 5, and this SiN film is patterned to form the stripe-shaped SiN film 11 which extends in the laser resonator

2 length direction, but does not reach a point where the laser resonator facet will be located, as shown in FIG. 6(b). The distance between the end of the SiN film 11 and the point where the resonator facet of the semiconductor laser will be located is about 20 μm and the width of the stripe-shaped SiN film, that is, the length in the direction perpendicular to the laser resonator length is 1.5–5.0 μm.

Next, as illustrated in FIG. 6(c), the Si film 22 is formed so as to cover the SiN film 11 and the contact layer 5, and then, as illustrated in FIG. 6(d), the wafer is annealed at a high temperature of 900° C. or above so that the Si diffuses from the Si film 22 through the contact layer 5 and reaches the inside of the lower cladding layer 2, thereby forming the Si diffusion region 15. During this diffusion process, the Si concentration in the active layer within the Si diffusion region 15 should reach about $3 \times 10^{18}$ cm$^{-3}$. The Si does not diffuse into a region under the SiN film 11 since the SiN film 11 is disposed between the Si film 22 and the contact layer 5. Because of this Si diffusion due to the annealing, a part of the quantum well structure active layer 3 which is in the Si diffusion region 15 is disordered.

The part of the quantum well structure active layer 3 which is disordered and is in the vicinity of the laser resonator facet becomes the window structure region 3b which functions as a window structure. The part of the quantum well structure active layer which is not disordered becomes the active region 3a.

Next, the Si film 22 and the SiN film 11 are removed by wet etching using preferably an HCl based etchant. Then, the surface of the contact layer 5 is covered with a resist, and this resist is patterned preferably by photolithographic, to form the stripe-shaped resist 14 having the same dimensions as those of the SiN film 11 and extending in the laser resonator length direction on the region where the SiN film 11 was disposed as shown in FIG. 6(e). Then, using this resist 14 as a mask, proton implantation is performed from the surface of the contact layer 5 to a depth reaching the inside of the upper cladding layer 4 but not reaching the active layer 3, thereby forming the region 8 which is implanted with protons within both the contact layer 5 and the upper cladding layer 4. This region becomes a high resistance region and functions as a current blocking layer.

Finally, the resist 14 is removed, and the p side electrode 10 is formed on the contact layer 5 and the n side electrode 9 on the substrate 1 side. Then, the wafer is cleaved and the laser resonator facet 20 is formed, thereby producing the semiconductor laser having the window structure shown in FIGS. 5(a)–5(b).

The operation of the prior art semiconductor laser will be described. When a voltage is applied to the semiconductor laser such that the p side electrode 10 becomes plus and the n side electrode 9 becomes minus, holes are injected to the quantum well structure active layer through the p type contact layer 5 and the p type upper cladding layer 4, while electrons are injected to the quantum well structure active layer through the n type semiconductor substrate 1 and the n type AlGaAs lower cladding layer 2. Recombination of the electrons and the holes occurs in the active region of the active layer 3 and an induced emission of light results in the active region 3a of the quantum well structure active layer 3. If the injection rate of carriers is raised sufficiently high and the generation of light becomes more enough to compensate the loss along the waveguide, a laser oscillation results. Since the region 8 which is implanted with protons becomes high resistance because of the proton implantation, current does not flow through parts of the p type contact layer 5 and the p type upper cladding layer 4 which are in the proton implanted region 8 but only through a region which is not implanted with protons.

The window structure will be described. The maximum optical output of an AlGaAs series semiconductor laser which generates laser light of 0.8 μm band wavelength and is generally used as a light source for optical disc devices, such as a compact disc (CD) player, is determined by the optical output at which facet damage occurs. The facet damage is a phenomenon in which crystals constituting the semiconductor laser melt because the heat generated by laser light absorption at surface energy levels in the facet region so the resonator can no longer function. Therefore, in order to realize high optical output operation, it is necessary to devise a means of avoiding the facet damage for higher optical outputs. In order to achieve this, it is effective to have a structure in a facet region of an active layer which impedes the absorption of the laser light, that is, a window structure which is "transparent" to the laser light. This window structure can be obtained by forming in the vicinity of the laser resonator facet a structure whose band gap energy is larger than that of the active region of the active layer which emits the laser light. In the prior art semiconductor laser shown in FIGS. 5(a)–5(b), since the active layer 3 comprises a quantum well structure, the window structure such as above is formed by the disordering of the quantum well structure 3 due to Si diffusion including a heat treatment process. FIGS. 7(a)–7(b) are diagrams illustrating profiles of the composition ratio of aluminum in the vicinity of the active layer 3 for describing the disordering of the quantum well structure. FIG. 7(a) illustrates the profile of the composition ratio of aluminum of the quantum well structure active layer 3 before the disordering, and FIG. 7(b) illustrates the profile of the composition ratio of aluminum of the quantum well structure active layer 3 after the disordering.

In FIGS. 7(a)–7(b), the same reference numerals used in FIGS. 5(a)–5(b) designate the same or similar parts, and reference numerals 30, 31, and 32 designate a well layer, a barrier layer, and a light guide layer of the active layer, respectively. Also in the figure, the ordinate represents the composition ratio of aluminum and the abscissa represents the location of the lower cladding layer 2, the active layer 3, and the upper cladding layer 4 in the direction of crystal growth, A12 represents the composition ratio of aluminum of the well layer 30, A11 represents the composition ratio of aluminum of the barrier layer 31 and the light guide layer 32, and A13 represents the composition ratio of aluminum of the active layer 3 after the disordering. When impurities such as zinc (Zn) or silicon (Si) are diffused into the quantum well structure active layer 3 as shown in FIG. 7(a), this diffusion is accompanied by the mixing of atoms constituting the well layer 30 and the barrier layer 31 and, as shown in FIG. 7(b), the composition ratio of aluminum of the region diffused with the impurities becomes A13, which is between A11 and A12, and the quantum well structure active layer is disordered. That is, the composition ratio of aluminum of the disordered quantum well structure active layer 3 becomes A13 which is almost equal to A11, the composition ratio of aluminum of the barrier layer 31 and the light guide layer 32, and the effective band gap energy of the active layer becomes almost equal to that of the barrier layer 31 and the light guide layer 32.

Therefore, since the effective band gap energy of the quantum well structure active layer which is disordered by the Si diffusion becomes larger than that of the active layer 3 which is not disordered and becomes the active region 3a, the disordered part of the quantum well structure active layer becomes "transparent" to the laser light and functions as the window structure. The region of the quantum well structure active layer 3 in the vicinity of the laser resonator facet 20 becomes the window structure region 3b.

As described above, in the prior art semiconductor laser having the window structure, the window structure region 3b is formed by disordering the part of the quantum well structure active layer 3 in the vicinity of the laser resonator facet 20 by the diffusion of impurities such as Si. However, in the process of diffusing Si, it is necessary to perform annealing at a high temperature of 900° C. or above for many hours. For example, the annealing performed at a temperature of 900° C. or above for ten hours or more gives a diffusion depth of 1.5 μm or more.

When the annealing is performed, however, constituent elements such as aluminum (Al) or gallium (Ga) in the region of the quantum well active layer 3, except the region to be disordered by the Si diffusion, that is, in the active region 3a of the quantum well structure active layer 3 thermally diffuse, and the steepness of interfaces between the well layer 30 and the barrier layer 31 or the light guide layer 32, which constitute the quantum well structure active layer 3 is damaged. As a result, the quantum effect is damaged and the excellent device characteristics of a semiconductor laser having a quantum well structure active layer are considerably deteriorated.

Furthermore, during the diffusion of an impurity such as Si, an n type dopant of the lower cladding layer 2 and a p type dopant of the upper cladding layer also diffuse and the interfaces between the active layer 3 and the lower cladding layer 2 and between the active layer 3 and the upper cladding layer 4 get mixed by this dopant diffusion, thereby damaging the steepness, so the active layer 3 becomes disordered along with the dopant diffusion, resulting in the deterioration of laser characteristics.

Furthermore, the n type dopant of the lower cladding layer 2 diffuses as far as the upper cladding layer 4 or the p type dopant of the upper cladding layer 4 diffuses as far as the lower cladding layer 2, resulting in the formation of a pn junction at a remote location from the quantum well active layer 3 in the upper cladding layer 4 or the lower cladding layer 2, which is referred to as a remote junction, and this deteriorates laser characteristics. In particular, zinc (Zn), which is often used as a p type dopant, has a high diffusion coefficient in GaAs or AlGaAs and easily diffuses under a heat treatment condition of long hours as described above, and a remote junction easily occurs.

SUMMARY OF THE INVENTION

It is an object of the present invention to provide a method of fabricating a semiconductor laser in which a window structure can be formed without diffusing dopant impurities at a high temperature, and a semiconductor laser fabricated by the fabricating method.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a method of fabricating a semiconductor laser comprises preparing a first conductivity type GaAs substrate having a front surface and a rear surface; successively epitaxially growing a first conductivity type $Al_xGa_{1-x}As$ (0<x<1) lower cladding layer, a quantum well structure active layer comprising a plurality of $Al_zGa_{1-z}As$ (0<z<x) barrier layers and a single or a plurality of $Al_yGa_{1-y}As$ (0<y<z) well layers(s), two of the barrier layers which become the outermost layers of the quantum well structure active layer functioning as a light guide layer, a second conductivity type $Al_rGa_{1-r}As$ (z<r<1) upper cladding layer, and a second conductivity type GaAs contact layer on the front surface of the substrate; diffusing In in the vicinity of a region of the quantum well structure active layer which becomes a laser resonator facet by heat treatment, thereby disordering this region of the quantum well structure active layer; and forming a first electrode and a second electrode on the rear surface of the substrate and the surface of the contact layer, respectively. Therefore, the active layer in the vicinity of the laser resonator facet can be disordered by diffusing In at a temperature as low as 600° C., and a window structure can be formed without diffusing dopant impurities at a high temperature.

According to a second aspect of the present invention, a method of fabricating a semiconductor laser comprises preparing a first conductivity type GaAs substrate having a front surface and a rear surface; successively epitaxially growing a first conductivity type $Al_xGa_{1-x}As$ (0<x<1) lower cladding layer, a quantum well structure active layer comprising a plurality of $Al_zGa_{1-z}As$ (0<z<x) barrier layers and a single or a plurality of $Al_yGa_{1-y}As$ (0<y<z) well layer(s), two of the barrier layers which become the outermost layers of the quantum well structure active layer functioning as a light guide layer, a second conductivity type $Al_rGa_{1-r}As$ (z<r<1) upper cladding layer, and a second conductivity type GaAs contact layer on the front surface of the substrate; forming an In diffusion blocking film extending in the direction which becomes the laser resonator length direction, having a length not reaching the vicinity of a region which becomes a laser resonator facet, of a stripe-shape having a prescribed width, and comprising a material which blocks the diffusion of In on the surface of the contact layer, and then, forming an In diffusion source film which becomes a diffusion source of In on the In diffusion blocking film and the contact layer; diffusing In from the In diffusion source film to a depth reaching the inside of the lower cladding layer by heat treatment, thereby disordering a part of the quantum well structure active layer which is in the region diffused with the In; removing the In diffusion source film and the In diffusion blocking film; forming a resist film on a region of the contact layer except the region which is diffused with the In, and then, using this resist film as a mask, implanting protons from the surface of the contact layer to a depth reaching the inside of the upper cladding layer but not reaching the quantum well structure active layer; removing the resist film; and forming a first electrode and a second electrode on the rear surface of the substrate and the surface of the contact layer, respectively. Therefore, the active layer in the vicinity of the laser resonator facet can be disordered by diffusing In at a temperature as low as 600° C., and a window structure can be formed without diffusing dopant impurities at a high temperature.

According to a third aspect of the present invention, in the method of fabricating a semiconductor laser described as the second aspect of the present invention, the In diffusion blocking film comprises SiN. Therefore, a window structure can be formed without diffusing dopant impurities at a high temperature.

According to a fourth aspect of the present invention, in the method of fabricating a semiconductor laser described as the second aspect of the present invention, the In diffusion blocking film comprises $SiO_2$. Therefore, a window structure can be formed without diffusing dopant impurities at a high temperature.

According to a fifth aspect of the present invention, in the method of fabricating a semiconductor laser described as the second aspect of the present invention, the In diffusion source film comprises In. Therefore, a window structure can be formed without diffusing dopant impurities at a high temperature.

According to a sixth aspect of the present invention, in the method of fabricating a semiconductor laser described as the second aspect of the present invention, the In diffusion source film comprises $In_2O_3$. Therefore, the uneven distribution of the diffused In on a plane parallel to the surface of the contact layer can be eliminated and the part of the quantum well structure active layer in the diffusion region can be uniformly disordered, thereby resulting in a window structure of a uniform quality.

According to a seventh aspect of the present invention, the method of fabricating a semiconductor laser described as the second aspect of the present invention further comprises forming an $SiO_2$ film on the In diffusion source film after forming the In diffusion source film; and removing the $SiO_2$ film after disordering the quantum well structure active layer. Therefore, the drop out of the As from the surface of the contact layer during the In diffusion can be prevented.

According to an eighth aspect of the present invention, in the method of fabricating a semiconductor laser described as the second aspect of the present invention, the first conductivity type substrate comprises n type GaAs; the first conductivity type lower cladding layer comprises n type $Al_xGa_{1-x}As$ (x=0.5); the quantum well structure active layer has a five-layer structure comprising three $Al_zGa_{1-z}As$ (z=0.2–0.35) barrier layers and two $Al_yGa_{1-y}Al$ (y=0.05–0.15) well layers, the barrier layers and the well layers being alternately laminated; the second conductivity type upper cladding layer comprises p type $Al_rGa_{1-r}As$ (r=0.5); and the second conductivity type contact layer comprises p type GaAs. Therefore, the active layer in the vicinity of the laser resonator facet can be disordered by diffusing In at a temperature as low as 600° C., and a window structure can be formed without diffusing dopant impurities at a high temperature.

According to a ninth aspect of the present invention, a semiconductor laser comprises a first conductivity type GaAs substrate having a front surface and a rear surface; a first conductivity type $Al_xGa_{1-x}As$ (0<x<1) lower cladding layer disposed on the front surface of the substrate; a quantum well structure active layer disposed on the lower cladding layer, comprising a plurality of $Al_zGa_{1-z}As$ (0<z<x) barrier layers and a single or a plurality of $Al_yGa_{1-y}As$ (0<y<z) well layers), two of the barrier layers which become the outermost layers of the quantum well structure active layer functioning as a light guide layer, and having a region disordered by the diffusion of indium (In) due to heat treatment in the vicinity of a laser resonator facet; a second conductivity type $Al_rGa_{1-r}As$ (z<r<1) upper cladding layer disposed on the quantum well structure active layer; a second conductivity type GaAs contact layer disposed on the upper cladding layer; a first electrode disposed on the rear surface of the substrate; and a second electrode disposed on the contact layer. Therefore, the active layer in the vicinity of the laser resonator facet can be disordered by diffusing In at a temperature as low as 600° C., and a window structure can be formed without diffusing dopant impurities at a high temperature.

According to a tenth aspect of the present invention, in the semiconductor laser described as the eighth aspect of the present invention, a region of the quantum well structure active layer except the vicinity of the laser resonator facets and except the stripe-shaped active region extending in the laser resonator length direction, having a prescribed width, is disordered by the diffusion of In due to heat treatment; and regions of an upper part of the upper cladding layer and the contact layer except the regions which are above the active region are implanted with protons and transformed to a high resistance region. Therefore, the active layer in the vicinity of the laser resonator facet can be disordered by diffusing In at a temperature as low as 600° C., and a window structure can be formed without diffusing dopant impurities at a high temperature.

BRIEF DESCRIPTION OF THE DRAWINGS

FIG. 5($a$) is a perspective view illustrating a prior art semiconductor laser, and FIG. 5($b$) is a cross-sectional view taken along the line 5$b$—5$b$ in FIG. 5($a$) of the same semiconductor laser.

FIGS. 6($a$)–6($e$) are process diagrams illustrating a method of fabricating the prior art semiconductor laser.

FIGS. 7($a$)–7($b$) are diagrams illustrating the aluminum profile of the wafer for describing the disordering of the quantum well structure layer of the prior art semiconductor laser.

DETAILED DESCRIPTION OF THE PREFERRED EMBODIMENTS

[Embodiment 1]

Figure 1:
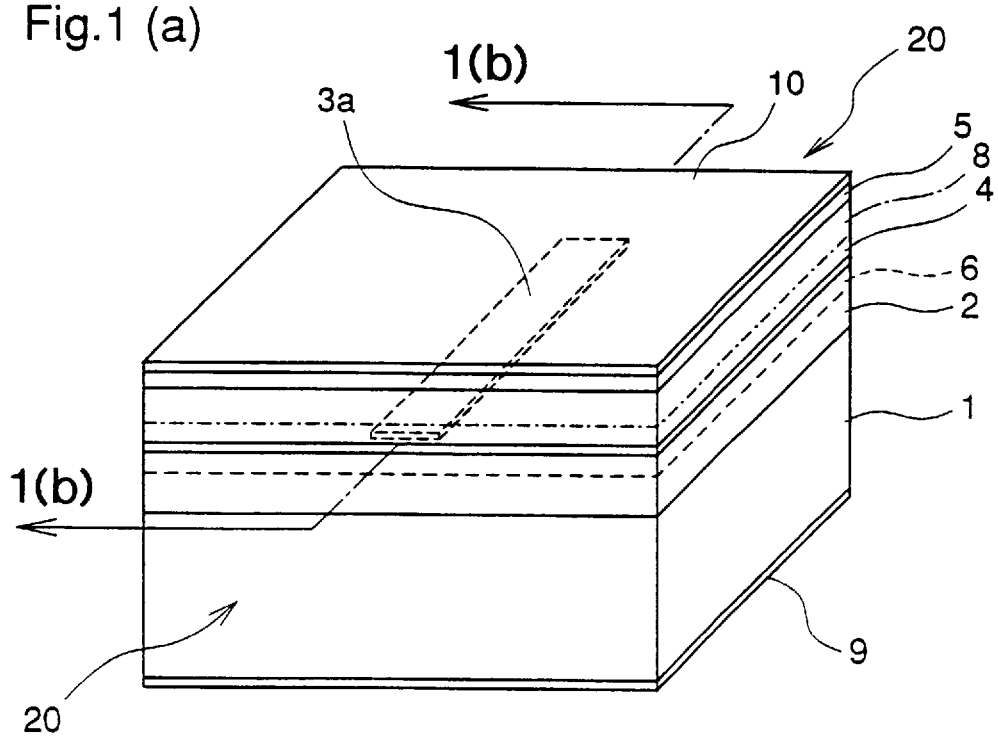
FIG. 1($a$) is a perspective view illustrating a semiconductor laser according to a first embodiment of the present invention, and FIG. 1($b$) is a cross-sectional view taken along the line 1$b$—1$b$ in FIG. 1($a$) of the same semiconductor laser.
Figure 1:
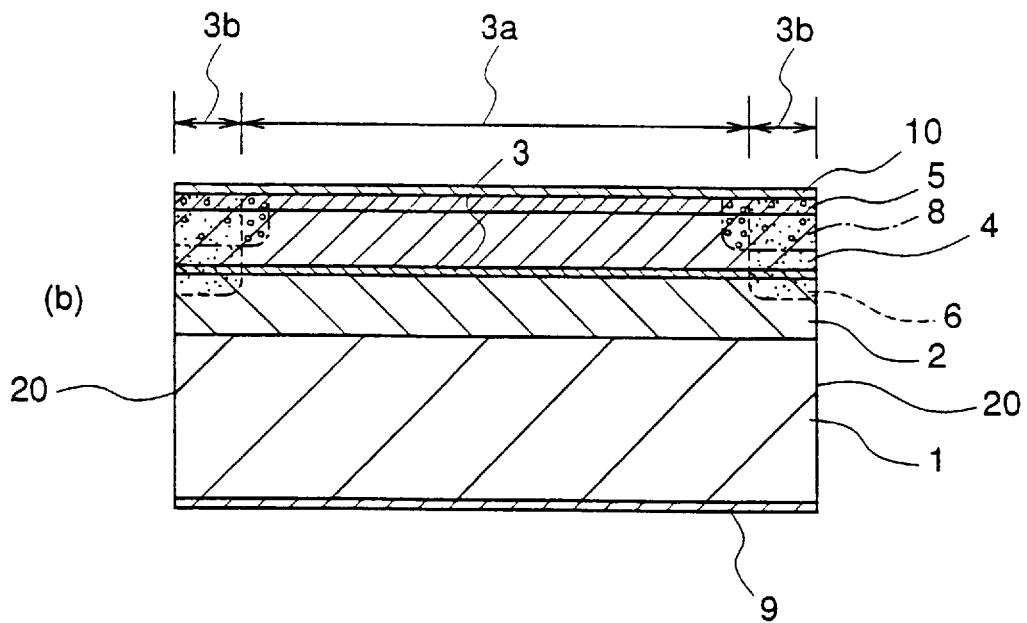

FIG. 1($a$) is a perspective view of a semiconductor laser according to a first embodiment of the present invention, and FIG. 1($b$) is a cross-sectional view of the same semiconductor laser taken along the line 1$b$—1$b$ in FIG. 1($a$), that is, a cross-sectional view in the laser resonator length direction. In the figures, reference numeral 1 designates an n type GaAs semiconductor substrate. An n type $Al_xGa_{1-x}As$ lower cladding layer 2 of a thickness of 1.5–2.0 $\mu$m and of a composition ratio of aluminum of x=0.5 is disposed on the substrate 1. Reference numeral 3 designates a quantum well structure active layer which comprises a five-layer structure comprising three $Al_yGa_{1-y}As$ well layers of a thickness of about 10 nm and of a composition ratio of aluminum of y=0.05–0.15 and two $Al_zGa_{1-z}As$ barrier layers of a thickness of about 10 nm and of a composition ratio of aluminum of z=0.2–0.35, the well layers and the barrier layers being alternately laminated, and two light guide layers of a thickness of about 35 nm and of the same composition as the barrier layer, one being disposed on the uppermost well layer and the other under the lowermost layer of the five-layer structure, respectively. Reference numeral 4 designates a p type $Al_rGa_{1-r}As$ upper cladding layer of a thickness of 1.5–2.0 $\mu$m and of a composition ratio of aluminum of r=0.5, reference numeral 5 designates a p type GaAs contact layer of a thickness of 0.5–1.0 $\mu$m, reference numeral 8 designates a proton implantation region, reference numeral 9 designates an n side electrode, reference numeral 10 designates a p side electrode, reference numeral 6 designates an indium (In) diffusion region, reference numeral 20 designates a laser resonator facet, reference numeral 3$a$ designates an active region of the active layer 3 which contributes to the laser light emission, and reference numeral 3$b$ designates a window structure region formed in the vicinity of the laser resonator facet 20 of the active layer 3. The dimensions of this semiconductor laser device are 300–600 $\mu$m in length in the resonator length direction and about 300 $\mu$m in width.

Figure 2:
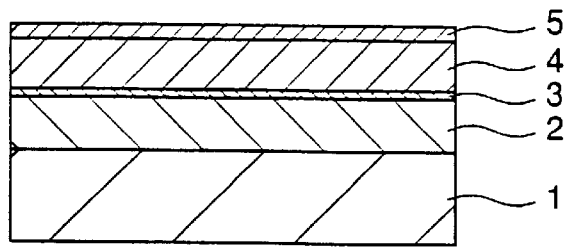
FIGS. 2($a$)–2($e$) are process diagrams illustrating a method of fabricating the semiconductor laser according to the first embodiment of the present invention.
Figure 2:
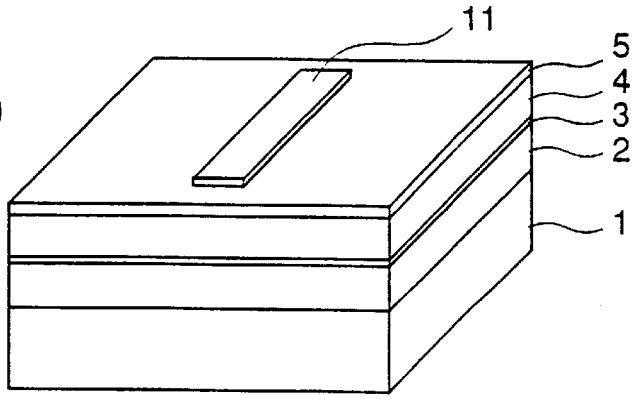
Figure 2:
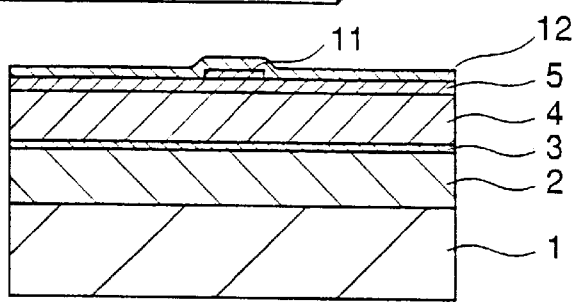
Figure 2:
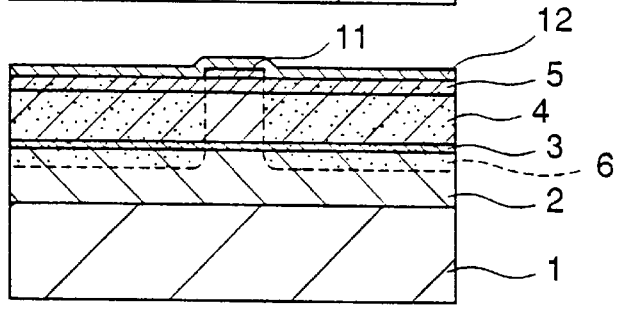
Figure 2:
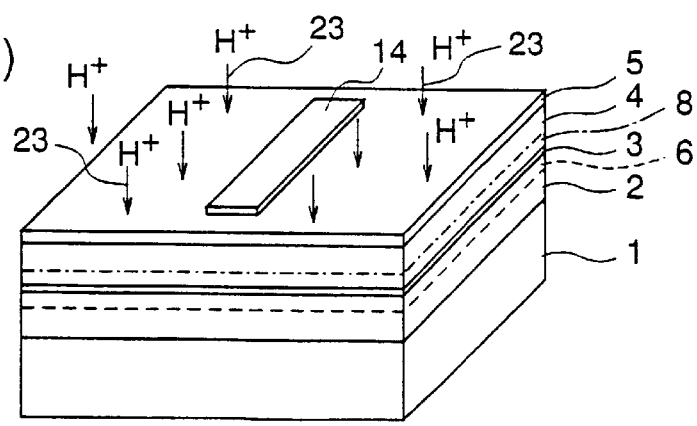

FIGS. 2($a$)–2($e$) are process diagrams illustrating a method of fabricating the semiconductor laser according to the first embodiment of the present invention. In the figures, the same reference numerals used in FIGS. 1($a$)–1($b$) designate the same or similar parts. Reference numeral 11 designates an SiN film, reference numeral 14 designates a photoresist, reference numeral 12 designates an In film, and reference numeral 23 designates proton implantation.

The method of fabrication will be described. First, the n type $Al_xGa_{1-x}As$ lower cladding layer 2, the quantum well structure active layer 3, the p type $Al_rGa_{1-r}As$ upper cladding layer 4, and the p type GaAs contact layer 5 are epitaxially grown in this order on the n type GaAs semiconductor substrate 1 which is in a wafer state (not shown as a wafer in the figures). For this epitaxial growth, metal organic chemical vapor deposition (MOCVD) or molecular beam epitaxy (MBE), both of which have an excellent controllability of layer thickness, are suited. The cross-section of the wafer after the epitaxial growth is shown in FIG. 2($a$).

Next, the surface of the p type contact layer 5 is covered with the SiN film, and a photolithographic and etching technique, the stripe-shaped SiN film 11 extending in the laser resonator length direction, but not reaching a point which becomes a laser resonator facet, is formed as shown in FIG. 2($b$). This SiN film 11 can be formed by, for example, plasma CVD. A thickness of 30–200 nm is appropriate for the SiN film 11 and the width of this stripe is 1.5–5.0 $\mu$m.

Next, the In film 12 is formed on the surfaces of the SiN film 11 and the contact layer 5. As a method for forming the film, electron beam evaporation, sputtering, or the like is employed. A width of 10–200 nm for the In film 12 is appropriate. The cross-section of the wafer after the formation of the In film 12 is shown in FIG. 2($c$).

After the In film 12 is formed, the wafer is placed in the annealing chamber for heat treatment. Since In diffuses into a semiconductor layer at a temperature of 600° C. or above, the In diffuses from the surface of the contact layer 5 to the inside of the lower cladding layer 2 even at this temperature and, as shown in FIG. 2($d$), the In diffusion region 6 is formed. During the heat treatment, in a part of the quantum well active layer 3 which is in the In diffusion region 6, the quantum well structure is disordered by the diffusion of In due to heat treatment, and the effective band gap energy in the disordered region of the quantum well structure active layer 3 becomes larger than that of the region which is not disordered. For this reason, the disordered region in the vicinity of the laser resonator facet becomes the window structure 3b which functions as a "window" to a laser light generated in the region of the active layer 3 which is not disordered, that is, the active region 3a.

Figure 8:
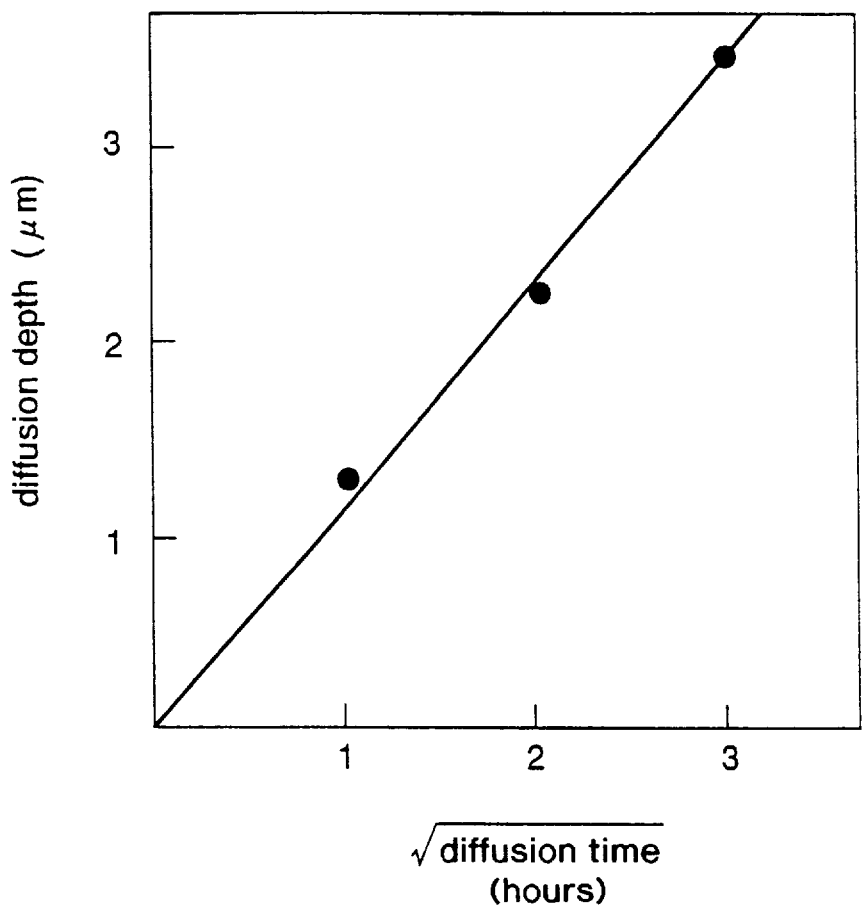
FIG. 8 is a graph illustrating a relationship between the diffusion depth of In and diffusion time for describing the In diffusion process in the method of fabricating the semiconductor laser of the first embodiment of the present invention.

The diffusion depth of In can be precisely controlled by controlling annealing time, and the relationship between the diffusion time and the diffusion depth for In diffusion in GaAs is shown in FIG. 8 as an example. In FIG. 8, the ordinate represents the diffusion depth (unit: $\mu$m) and the abscissa represents the square root of the diffusion time. Since In does not diffuse through the SiN film 11, the In does not diffuse under the stripe-shaped SiN film 11. In this embodiment, it is preferable that In diffuses until the diffusion concentration of In in the active layer 3 becomes $5 \times 10^{18}$ cm$^{-3}$. In place of the SiN film 11, a film comprising a material which prevents diffusion of In such as SiO$_2$ can be used.

After In is diffused, the In film 12 and the SiN film 11 are removed by wet etching preferably using an HCl based etchant. Next, the surface of the contact layer 5 is covered with a resist film, and then, using a photolithographic technique, the stripe-shaped resist 14 having the same dimensions as those of the SiN film 11 and extending in the laser resonator length direction is formed where the SiN film 11 was formed as shown in FIG. 2(e). Then, using this resist 14 as a mask, proton implantation 23 is performed from the surface of the contact layer 5 to a depth reaching the inside of the upper cladding layer 4 but not reaching the active layer 3 until the concentration becomes about $4 \times 10^{19}$ cm$^{-3}$. As a result, the proton implantation region 8 comprising parts of the contact layer 5 and the upper portion of the upper cladding layer 4, except the sub-region of the resist 14, which are implanted with protons, is formed. This proton implantation region 8 becomes a high resistance region and functions as a current blocking layer.

Finally, the p side electrode 10 is formed on the contact layer 5 side and the n side electrode 9 on the GaAs substrate 1 side. Then, the wafer is cleaved and a pair of laser resonator facets 20 are formed, thereby resulting in the semiconductor laser.

In the semiconductor laser according to the first embodiment, since a part of the active layer 3 which is in the In diffusion region 6 is disordered due to the diffusion of In by heat treatment, the band gap energy of this disordered region larger than that of the region which is not disordered, that is, the active region 3a as described in the prior art. Therefore, a part of this disordered region in the vicinity of the laser resonator facet 20 becomes the window structure region 3b which does not absorb the laser light. Furthermore, since the regions of the active layer 3 which are adjacent to the active region 3a in the direction perpendicular to the laser resonator length direction are also disordered, a refractive index distribution results in the active layer 3 in the direction perpendicular to the laser resonator length direction, and the laser light is confined in the active region 3a and guided in the laser resonator length direction.

In the first embodiment, the quantum well structure active layer 3 is disordered by the diffusion of In which occurs due to the annealing in order to form a window structure. Since In diffuses at an annealing temperature which is lower than that for Si diffusion by 200° C. or more, degradation of steepness of the interfaces between the well layer and the barrier layer or the light guide layer in the active region 3a of the quantum well structure active layer 3 can be prevented, in contrast to the prior art semiconductor laser.

Similarly, the diffusion can be performed at a lower annealing temperature and, consequently, the diffusion of the n type dopant and the p type dopant which are included in the n type lower cladding layer 2 and the p type upper cladding layer 4, respectively, can be impeded. The degradation of steepness of the interfaces between the active layer 3 and both the n type lower cladding layer 2 and the p type upper cladding layer 4 due to the diffusion of the dopants within the active region 3a of the active layer 3, the disordering of the active region 3a of the active layer 3, and the occurrence of a remote junction in which a dopant of the upper cladding layer or the lower cladding layer diffuses to another cladding layer, all of which occur in the prior art semiconductor laser, can be avoided and the degradation of original laser characteristics can be prevented.

Furthermore, in the prior art semiconductor laser, Si, which is a Group IV element, is diffused in to the GaAs based semiconductor laser which is a III–V semiconductor material Si becomes the impurity affecting the conductivity type of the semiconductor layer and forms a high concentration impurity region, creating a steep change in conductivity type. Therefore it is difficult to transform the diffusion region to a high resistance region during a subsequent process of proton implantation. However, since In used in this embodiment is a Group III element like Ga in GaAs, it differs from the case in which a dopant element such as Si is diffused. In does not form the high impurity concentration region, making it easier to transform the diffusion region to a high resistance region than in the case of Si diffusion.

As described above, according to the first embodiment, since In is diffused to a part of the quantum well structure active layer 3 in the vicinity of the laser resonator facet 20 by heat treatment, and thus the window structure is formed, it is possible to disorder a part of the active layer 3 in the vicinity of the laser resonator facet 20 even at a temperature of about 600° C. and to form the window structure without performing diffusion of a dopant impurity at a high temperature. As a result, this fabricating method has an effect of providing a high quality semiconductor laser.

[Embodiment 2]

Figure 3:
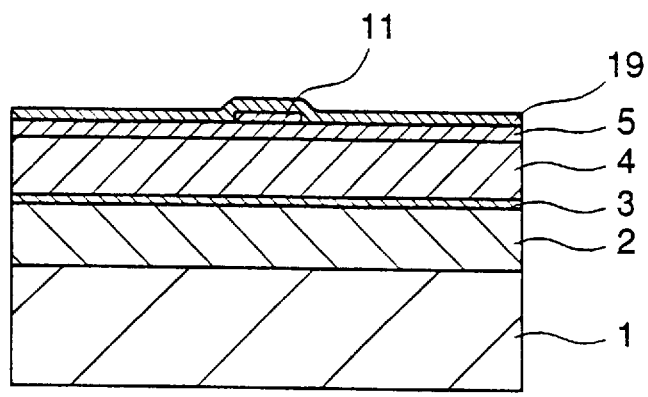
FIG. 3 is a cross-sectional view illustrating the main process of a method of fabricating a semiconductor laser according to a second embodiment.

FIG. 3 is a cross-sectional view section perpendicular to the laser resonator length direction and illustrating the main process of a method of fabricating a semiconductor laser according to a second embodiment. In the figure, reference numeral 19 designates an In$_2$O$_3$ film. In the second embodiment, the In$_2$O$_3$ film 19 is used instead of the In film 12 which was used to diffuse In in the first embodiment.

In the first embodiment, the In film 12 formed on the contact layer 5 was used as a diffusion source of the In diffusion. In that case, however, there is a possibility that a balling may occur, which is a phenomenon in which the In film 12 on the surface melts during heating for In diffusion and forms a ball due to surface tension. When this phenomenon occurs, the distribution of the In film 12 over the contact layer 5 becomes uneven, and since the In diffusion starts at each location where the In film 12 melts and scatters, it becomes difficult to control the diffusion location, the diffusion depth, and the diffusion amount with respect to a plane parallel to the surface of the contact layer 5. As a result, it becomes impossible to uniformly perform the disordering for forming a window structure in the In diffusion region 6 in the active layer 3.

The second embodiment resolves this situation. In the second embodiment, the process of forming the In film 12 on the surface of the contact layer 5 in the method of fabricating a semiconductor laser according to the first embodiment illustrated in FIG. 2(c) is replaced with a process of forming the In$_2$O$_3$ film 19 as shown in FIG. 3. If the In$_2$O$_3$ film 19 is used as the In diffusion source as in the second embodiment, since the oxide of In is stable thermally and harder to melt than the In film 12 and, therefore, the balling phenomenon does not occur, uniform diffusion of In can be realized.

As described above, according to the second embodiment, since the $In_2O_3$ film 19 is formed on the contact layer 5 and the SiN film 11 instead of the In film and is used to diffuse In, the uneven distribution of the In diffusion in a part of the quantum well structure active layer which is in the diffusion region in a plane parallel to the surface of the contact layer can be avoided. The part of the quantum well structure active layer which is in the diffusion region can be uniformly disordered and a window structure of uniform quality can be formed. As a result, this fabricating method has an effect of providing a high quality semiconductor laser.

[Embodiment 3]

Figure 4:
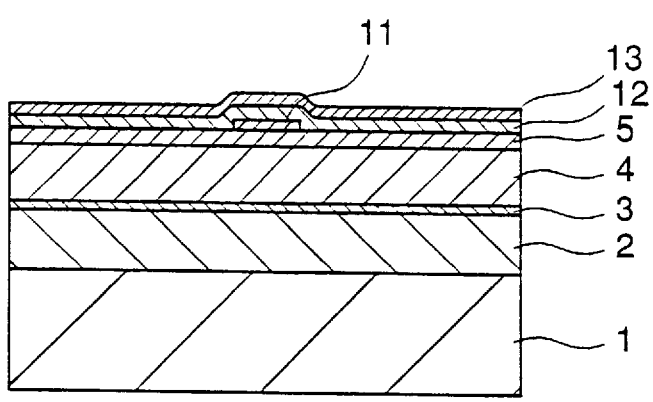
FIG. 4 is a cross-sectional view illustrating the main process of a method of fabricating a semiconductor laser according to a third embodiment.

FIG. 4 is a cross-sectional view sectioned perpendicular to the laser resonator length direction and illustrating the main process of a method of fabricating a semiconductor laser according to a third embodiment. In the figure, reference numeral 13 designates an $SiO_2$ film.

In the first embodiment, when the wafer is annealed to diffuse In, the wafer is heated up to a temperature of 600° C. or above. When the GaAs crystal, which is a material of the contact layer 5, is subjected to a temperature of 600° C. or above, arsenic (As) is lost from the crystals and the surface becomes rough. When surface roughness such as this occurs, in a process of forming an electrode, for example, when disposing a resist on the contact layer 5 and patterning it, unevenness occurs on the resist surface. This makes it difficult to focus light during exposure and to form a desired pattern.

In the third embodiment, in order to prevent the escape of As which occurs during the In diffusion, the $SiO_2$ film 13 which can block the escape of As is disposed on the In film 12 after the process of forming the In film 12 as shown in FIG. 2(c) of the first embodiment, and then, In is diffused in a process similar to the one of the first embodiment. Since the $SiO_2$ film 13 is formed and this $SiO_2$ film functions as a blocking film for the As which is escaping, by preventing the escaping of the arsenic from the surface of the contact layer 5, the surface roughness of the contact layer 5 is considerably reduced. Consequently, in the subsequent process of forming an electrode, an electrode of a desired shape can easily be formed. This $SiO_2$ film 13 can easily be removed with hydro fluoric acid or the like after the In diffusion process.

As described above, according to the third embodiment, since the quantum well structure active layer 3 is disordered by the In diffusion after the $SiO_2$ film 13 is formed on the In film 12, the escape of As from the surface of the contact layer during the In diffusion process can be blocked and the surface roughness of the contact layer 5 is prevented.

While, according to the third embodiment, the process of forming the $SiO_2$ film on the In film is added to the method of fabricating a semiconductor laser of the first embodiment, the process of forming the $SiO_2$ film on the $In_2O_3$ film can be added in the present invention to the method of fabricating a semiconductor laser of the second embodiment to block the escape of As during the In diffusion process, and similar effects as in the third embodiment can be obtained.

Furthermore, while, in the first, second, and third embodiments, a semiconductor laser having a structure in which portions of the contact layer and the upper part of the upper cladding layer except the portions above the active region of the active layer are transformed to a high resistance region by proton implantation is described, the present invention can be applied to other semiconductor lasers having other structures such as a semiconductor laser having a ridge structure. In these cases, by diffusing In in the vicinity of the laser resonator facet by heat treatment and thereby disordering the corresponding region of the quantum well structure active layer, similar effects as in the above embodiments can be obtained.

What is claimed is:

1. A semiconductor laser comprising:

a first conductivity type GaAs substrate having a front surface and a rear surface;

a first conductivity type $Al_xGa_{1-x}As$ (0<x<1) lower cladding layer disposed on the front surface of the substrate;

a quantum well structure active layer disposed on the lower cladding layer, comprising a plurality of $Al_zGa_{1-z}As$ (0<z<x) barrier layers and at least one $Al_yGa_{1-y}As$ (0<y<z) well layer, two of the barrier layers sandwiching the quantum well structure active layer and functioning as light guide layers, and having a region disordered by In due in the vicinity of a laser resonator facet;

a second conductivity type $Al_rGa_{1-r}As$ (z<r<1) upper cladding layer disposed on the quantum well structure active layer;

a second conductivity type GaAs contact layer disposed on the upper cladding layer;

a first electrode disposed on the rear surface of the substrate; and a second electrode disposed on the contact layer.

2. The semiconductor laser of claim 1 wherein:

a region of the quantum well structure active layer proximate the laser resonator facet but not in the stripe-shaped active region extending in a laser resonator length direction and having a width, is disordered by In; and regions of the upper cladding layer and the contact layer, except regions opposite the active region are implanted with protons and have a high resistance.

* * * * *